United States Patent [19]

Young

[11] Patent Number: 4,683,432

[45] Date of Patent: Jul. 28, 1987

[54] NUCLEAR MAGNETIC RESONANCE METHODS AND APPARATUS

[75] Inventor: Ian R. Young, Sunbury-on-Thames, England

[73] Assignee: Picker International, Inc., Wembley, England

[21] Appl. No.: 908,576

[22] Filed: Sep. 18, 1986

[30] Foreign Application Priority Data

Sep. 25, 1985 [GB] United Kingdom ............... 8523673

[51] Int. Cl.$^4$ ........................................... G01R 33/20
[52] U.S. Cl. .................................... 324/309; 324/312
[58] Field of Search ............... 324/307, 309, 312, 310, 324/311

[56] References Cited

U.S. PATENT DOCUMENTS

| | | | |
|---|---|---|---|
| 3,781,650 | 12/1973 | Keller | 324/311 |
| 4,021,726 | 5/1977 | Garroway et al. | 324/309 |
| 4,468,621 | 8/1984 | Hinshaw | 324/309 |
| 4,471,305 | 9/1984 | Crooks et al. | 324/309 |
| 4,480,228 | 10/1984 | Bottomley | 324/309 |
| 4,502,008 | 2/1985 | Ohuchi | 324/311 |
| 4,563,647 | 1/1986 | Young | 324/309 |
| 4,620,154 | 10/1986 | Inouye | 324/309 |

FOREIGN PATENT DOCUMENTS

| | | |
|---|---|---|
| 0088970 | 9/1983 | European Pat. Off. |
| 0089534 | 9/1983 | European Pat. Off. |
| 1525564 | 9/1978 | United Kingdom |
| 2114756 | 8/1983 | United Kingdom |

Primary Examiner—Stewart J. Levy
Assistant Examiner—Kevin D. O'Shea
Attorney, Agent, or Firm—Timothy B. Gurin

[57] ABSTRACT

A nuclear magnetic resonance method and apparatus for examining a predetermined particular location (55) in a body wherein processed data obtained from four procedures are combined to extract processed data relating to the particular location. Each procedure comprises exciting spins in a region (45) of the body including the location (55) and acquiring and processing data in respect of the excited spins. In a first procedure the excited spins are of the same phase throughout the region (45). In a second procedure the excited spins are of a first phase in a first portion (49) of the region (45) of which portion the predetermined location (55) forms part, and are of the opposite phase in the rest of the region (45). In a third procedure the excited spins are of a first phase in a second portion (53) of the region which intersects the first portion (45) at the predetermined location (55) and are of the opposite phase in the rest of the region (45). In a fourth procedure the excited spins are of a first phase in the first and second portions (49 and 53), excluding the predetermined location (55), and are of the opposite phase in the rest of the region (45). Adding the processed data signals from the first and fourth procedures and subtracting the processed data signals for the second and third procedures gives a resultant signal relating to the predetermined location (55) only.

5 Claims, 4 Drawing Figures

NUCLEAR MAGNETIC RESONANCE METHODS AND APPARATUS

This invention relates to nuclear magnetic resonance (NMR) methods and apparatus.

NMR techniques have been used for chemical analysis of material i.e. spectroscopy for many years. More recently NMR techniques have been used to obtain images representing the distribution in a selected region of a body, normally a cross-sectional slice, of a chosen quantity, e.g. the density of chosen nucleons, for example, hydrogen protons, or of NMR spin relaxation time constants. Such distributions are similar to, but of different significance from, the distributions of X-ray attenuation provided by computerised tomography systems, and have thus found especial application in medical examination of patients.

In an NMR imaging method, the essential steps are exciting nuclear spins in the region of the body to be investigated and acquiring and processing data in respect of the spins. The acquiring and processing of data normally comprises detecting the excited spins and then analysing the detected signals by Fourier transformation and convolution.

In the use of an NMR imaging apparatus it is sometimes required to examine a predetermined location only in a body, for example, to facilitate obtaining sufficient data for high resolution NMR spectroscopy of the material at the location.

Many methods have been proposed for doing this but most require the use of specially designed coils placed on or near the surface of the body being investigated which is not suitable for examining internal tissues, such as the liver of a patient, or the use of spin echo techniques which is unsatisfactory when spin-spin relaxation time (T2) data is required.

It is an object of the present invention to provide an NMR method and apparatus suitable for use in examining a predetermined location only in a body and which does not require the use of specially designed coils or spin echo techniques.

According to the present invention a method of examining a predetermined location in a body using NMR techniques comprises: carrying out four separate procedures each comprising exciting spins in a region of the body including said predetermined location and acquiring and processing data in respect of said spins, the procedures differing in that in a first procedure the excited spins are of the same phase throughout said region, in a second procedure the excited spins are a first phase in a first portion of said region of which said predetermined location forms part and of the opposite phase in the rest of said region, in a third procedure the spins are of a first phase in a second portion of said region which intersects said first portion at said predetermined location and are of the opposite phase in the rest of said region, and in a fourth procedure the spins are of a first phase in the first and second portions, excluding said predetermined location, and are of the opposite phase in the rest of said region; and combining the processed data obtained in said four procedures to extract processed data relating to said predetermined location only.

The invention also provides an apparatus arranged to carry out a method according to the invention.

One method and apparatus in accordance with the invention will now be described by way of example with reference to the accompanying drawings in which.

FIG. 4 futher illustrates the method.

The apparatus is for the most part of conventional form, for example, as described in United Kingdom Patent Specification No. 1,578,910 and U.S. Pat. Spec. No. 4,284,948 or United Kingdom Patent Specification No. 2,056,078 and U.S. Pat. Spec. No. 4,355,282.

The basic elements of such an apparatus are as follows:

The apparatus includes a first coil system wherby a magnetic field can be applied to a body to be examined in a given direction, normally designated the Z-direction, with a gradient in any one or more of the three orthogonal directions i.e. X, Y and Z directions.

Figure 1:
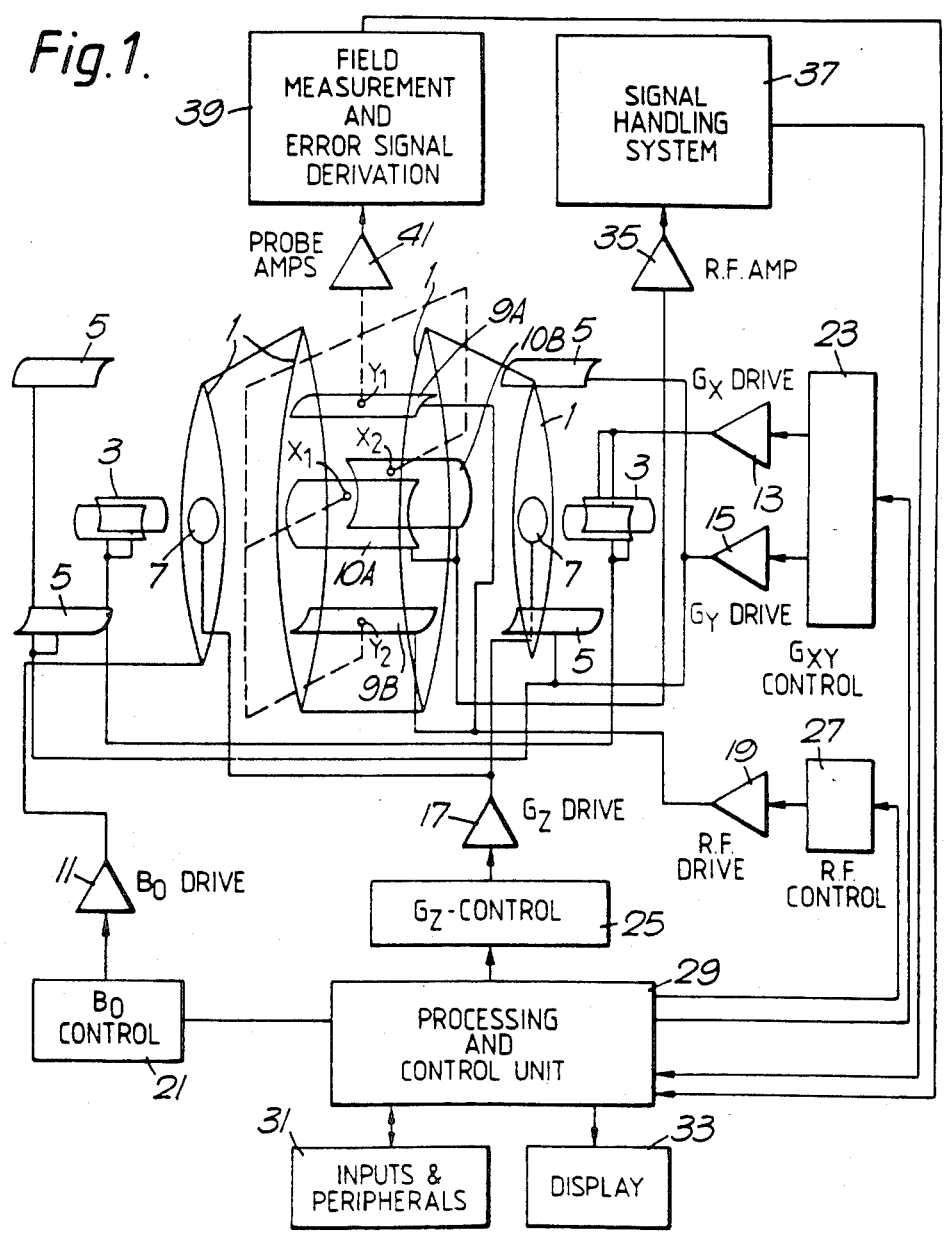
FIGS. 1 and 2 illustrate the apparatus diagrammatically.

Referring to FIG. 1, the first coil system comprises coils 1 which provide a steady uniform magnetic field Bo in the Z-direction; coils 3 which provide a magnetic field gradient Gx in the X-direction, coils 5 which provide a magnetic field gradient Gy in the Y-direction; and coils 7 which provide a magnetic field gradient Gz in the Z-direction.

In addition, the apparatus includes a second coil system whereby RF magnetic fields can be applied to the body under examination in a plane normal to the direction of the magnetic field produced by the first coil system, and whereby RF magnetic fields resulting from nuclei in the body under examination which have been excited to nuclear magnetic resonance with a spin vector component other than in the Z-direction can be detected.

The second coil system comprises a first coil arrangement comprising a pair of coils 9A and 9B for applying RF fields, and a second coil arrangement comprising coils 10A and 10B for detecting RF fields.

The various coils 1, 3, 5, 7 and 9A and 9B are driven by Bo, Gx,Gy, Gz and RF drive amplifiers 11, 13, 15, 17 and 19 respectively, controlled by Bo, Gxy, Gz and RF control circuits 21, 23, 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus and a display 33.

The NMR signals detected by the coils 10A and 10B are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that whilst shown separately to clarify the present description, the signal handling system 37 may conveniently form part of the unit 29.

Figure 2:
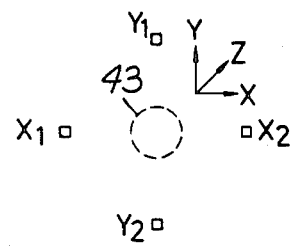

The apparatus also includes field measurement and error signal circuits 39 which receive signals via amplifiers 41 from field probes $X_1$, $X_2$, $Y_1$ and $Y_2$ which are disposed at suitable positions in relation to the body 43 being examined, as illustrated in FIG. 2, to monitor the applied magnetic fields.

The apparatus is arranged to examine a predetermined location in the body 43 by the following method.

The body 43 being examined is first positioned in the apparatus so as to be subject to the field produced by the first and second coil system.

The steady magnetic field Bo is then applied in the Z-direction by means of coils 1, this field serving to define an equilibrium axis of magnetic alignment in the body, i.e. along the Z-direction, and remaining constant throughout the examination.

The examination consists of four procedures as follows.

Figure 3:
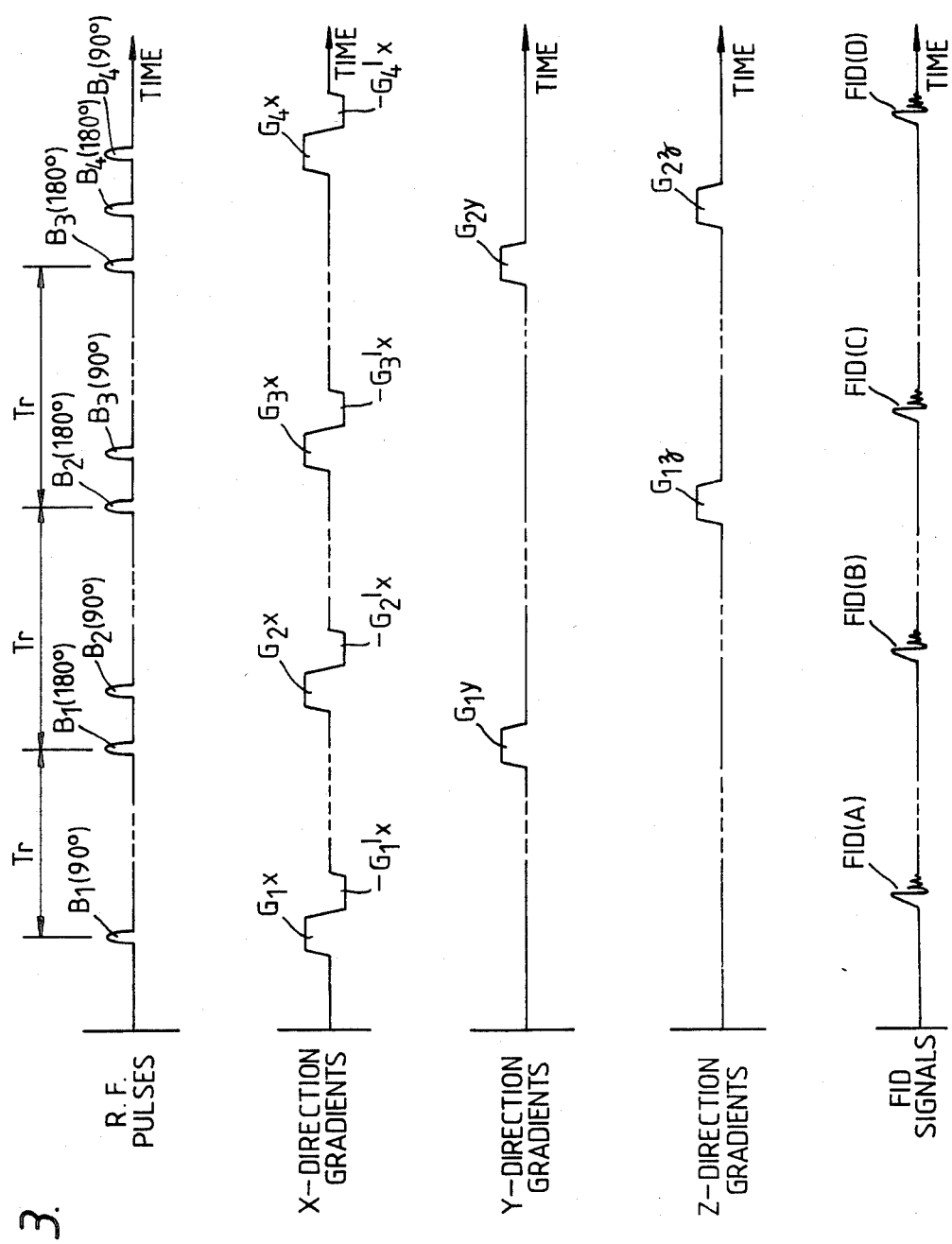
FIG. 3 illustrates the field sequences employed in the method.
Figure 4A:
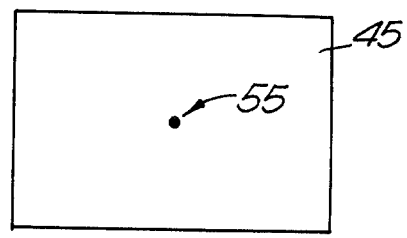
Figure 4B:
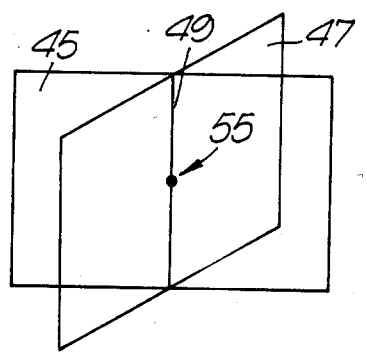
Figure 4C:
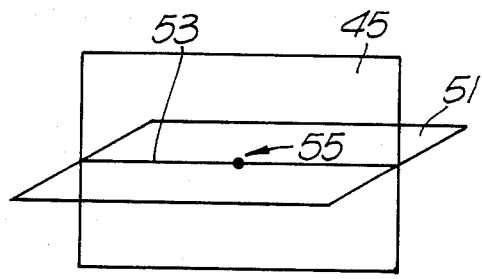
Figure 4D:
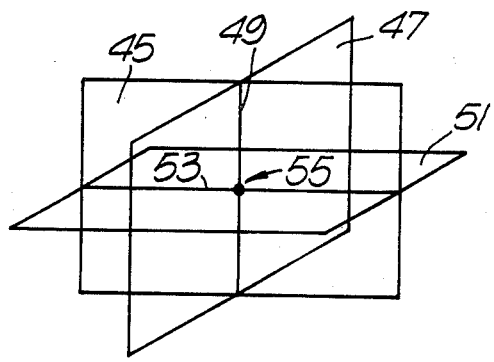

Referring now to FIGS. 3 and 4 in the first procedure a magnetic field gradient is first applied, in a direction normal to a selected slice 45 (see FIG. 4A) of the body containing the location 55 it is desired to examine, by means of coils 3, 5 or 7, as appropriate. For the purposes of the present example the body and hence the slice 45 are taken to be rectangular and the slice 45 is taken to lie in the Y-Z plane. Hence, the applied gradient is in the X-direction, and is thus denoted by G1x in FIG. 3. Whilst this gradient G1x is being applied an RF magnetic field pulse denoted B (90°) is applied. The frequency of the RF pulse is chosen to be at the Larmor frequency of chosen nuclei, typically hydrogen nulei, in the slice of the body to be imaged. Since the strength of the magnetic field and hence the Larmor frequency of the chosen nuclei outside the slice differs from the frequency of the applied RF pulse, nuclei spins within the slice only are excited by the RF pulse. The integral of the RF pulse is such that the pulse is just sufficient to tip the spins of the excited nuclei through 90° i.e. in the present case from the Z-direction into the X-Y plane, the spins then precessing in the X-Y plane around the Z-axis.

The applied magnetic field gradient G1x is then removed and a reverse gradient $-G1'x$ applied to rephase the spins in the selected slice against dephasing resulting from the gradient aross the slice during excitation, as described for example in United Kingdom Patent Specification No. 1,578,910 and U.S. Pat. Spec. No. 4,284,948.

Immediately after the gradient $-G1'x$ is removed, the signal induced in the coils 10A and 10B by the spins excited in the selected slice, commonly called the free induction decay (FID) signal, is recorded, this signal being denoted FID (A) in FIG. 3. The recorded signal FID (A) is then processed in known manner by Fourier transformation and convolution to obtain a signal, referred to hereafter as signal A, which represents the frequency spectrum of the spins in the slice. This signal A is also recorded.

The start of the second procedure is delayed unitl a time Tr after the B1(90°) RF pulse of the first procedure to allow the spins excited in the first procedure to recover to the Z-direction.

In the second procedure an RF pulse B1(180°) is first applied in the presence of a magnetic gradient Gy in the Y-direction so as to invert (i.e. align with the $-Z$-direction) the spins in a slice 47 (see FIG. 4B) lying in the X-Z plane which intersects the Y-Z plane slice 45 along a strip 49 along a strip 49 containing the location 55 to be examined. The spins are then again excited in the Y-Z slice 45 in the same manner as the first procedure by means of an RF pulse B2(90°) in association with a selection gradient G2x and rephasing gradient $-G2'x$.

The resulting FID signal FID (B) is then detected and processed to produce a signal B representing the frequency spectrum of the spins excited in the slice 45 during the second procedure. It will be appreciated that signal B is thus identical to signal A except that the signal derived from strip 49, hereinafter called signal J, is inverted with respect to, i.e. of opposite phase to, the signal derived from the rest of the slice 45.

In the third procedure, which is delayed until a time Tr after the B2(90°) RF pulse, an RF pulse B2(180°) is first applied in the presence of a magnetic field gradient G'z in the Z-direction so as to invert the spins in a slice 51 (see FIG. 4C) lying in the X-Y plane which intersects the Y-Z plane slice 45 along a strip 53 containing the location 55 to be examined. The Y-Z slice 45 is then again excited as in the first procedure by means of an RF pulse B3(90°) in association with a selection gradient G3x and rephasing gradient $-G3'x$. The resulting FID signal FID (C) is then detected and processed to produce a signal C identical to signal A except that the signal derived from strip 53, hereinafter called signal K, is inverted with respect to the signal derived from the rest of the slice 45.

In the fourth procedure, which starts at a time Tr after the B3(90°) RF pulse, an RF pulse B3(180°), in association with a selection gradient G2y and then an RF pulse B4(180°) in association with a selection gradient G2z are first applied. By this process the spins in slice 47 are first inverted and then the spins in slice 51 are inverted. As a result, the spins in strips 49 and 53 excluding the location 55 (see FIG. 4D) to be examined are inverted with respect to the spins in the rest of the slice 45, including the location 55.

The Y-Z slice 45 is then again excited, as in the first procedure, by means of an RF pulse B4(90°) in association with a selection gradient G4x and rephasing gradient $-G4'x$. The resulting FID signal FID (D) is then detected and processed to produce a signal D identical to the signal A except that the signal derived from strips 49 and 53 excluding the location 55 is inverted with respect to the signal derived from the rest of the slice 45.

Since the signal B is identical to signal A but with the part of the signal from strip 49 inverted, signal B may be expressed as follows:

$$B = A - 2J$$

Similarly signal C may be expressed as $$C = A - 2K$$

and signal D may be expressed as $$D = A - 2J - 2K + 4L$$

where L represents the signal from the location 55.

Hence the signal L from location 55 may be obtained by combining signals A, B, C and D as follows:

$$\tfrac{1}{4}(A + D - B - C)$$
$$= \tfrac{1}{4}(A + A - 2J - 2K + 4L - A + 2J - A + 2K)$$
$$= L$$

It will be appreciated that the location 55 may be positioned at any desired position in the body by suitable choice of the frequencies of the RF pulses and/or slice selection gradients.

It will be understood that the four procedures need not be carried out in the order described above, but may be carried out in any order. Furthermore, whilst the excitation and detection stages of each procedure must be carried out separately, the processing stages of the four procedures may be carried out at any time i.e. during the excitation and detection steps of another procedure.

It will be further understood that instead of having a delay period Tr between procedures to achieve relaxation of spins to the Z-direction, positive steps to achieve more rapid relaxation may be taken after detection of the FID signals.

What is claimed is:

1. A method of examining a predetermined location in a body using NMR techniques comprising: carrying out four separate procedures each comprising exciting spins in a region of the body including said predetermined location and acquiring and processing data in respect of said spins, the procedures differing in that in a first procedure the excited spins are of the same phase throughout said region, in a second procedure the excited spins are of a first phase in a first portion of said region of which said predetermined location forms part and of the opposite phase in the rest of said region, in a third procedure the spins are of a first phase in a second portion of said region which intersects said first poriton at said predetermined location and are of the opposite phase in the rest of said region, and in fourth procedure the spins are of a first phase in the first and second poritons, excluding said predetermined location, and are of the opposite phase in the rest of said region; and combining the processed data obtained in said four procedures to extract processed data relating to said predetermined location only.

2. A method according to claim 1 wherein the processed data are combined according to the formula $$A+D-B-C$$

where A, B, C and D are respectively the processed data obtained in said first, second, third and fourth procedures.

3. A method according to claim 1 wherein; in said second procedure spins are excited by inverting spins in a first further region of said body which intersects said region at said first portion, and exciting spins in said region; in said third procedure spins are excited by inverting spins in a second further region of said body which intersects said region at said second portion, and exciting spins in said region; and in said fourth procedure said spins are excited by inverting spins in said first further region, inverting spins in said second further region, and exciting spins in said region.

4. A method according to claim 3 wherein said regions are all planar slices of the body.

5. A method according to claim 4 wherein said regions are mutually perpendicular.

* * * * *